United States Patent [19]
Proebsting

[11] Patent Number: 5,982,700
[45] Date of Patent: Nov. 9, 1999

[54] BUFFER MEMORY ARRAYS HAVING NONLINEAR COLUMNS FOR PROVIDING PARALLEL DATA ACCESS CAPABILITY AND METHODS OF OPERATING SAME

[75] Inventor: Robert J. Proebsting, Los Altos Hills, Calif.

[73] Assignee: Integrated Device Technology, Inc., Santa Clara, Calif.

[21] Appl. No.: 09/082,853

[22] Filed: May 21, 1998

[51] Int. Cl.$^6$ ................................................ G11C 8/00
[52] U.S. Cl. .......................... 365/230.05; 365/189.04; 711/131; 711/149
[58] Field of Search .................. 365/230.05, 189.04, 365/220, 221; 711/131, 149, 150

[56] References Cited

U.S. PATENT DOCUMENTS

| | | | |
|---|---|---|---|
| 4,402,067 | 8/1983 | Moss et al. .............................. | 365/219 |
| 4,577,293 | 3/1986 | Matick et al. .......................... | 365/189 |
| 4,731,758 | 3/1988 | Lam et al. .............................. | 365/189 |
| 4,758,987 | 7/1988 | Sakui ...................................... | 365/189 |
| 4,761,647 | 8/1988 | Hallenbeck et al. ............... | 340/825.22 |
| 4,829,471 | 5/1989 | Banerjee et al. ....................... | 364/900 |
| 4,837,746 | 6/1989 | Banerjee et al. .................. | 365/189.05 |
| 4,849,935 | 7/1989 | Miyazawa .......................... | 365/189.05 |
| 4,894,770 | 1/1990 | Ward et al. ............................. | 364/200 |
| 4,926,385 | 5/1990 | Fujishima et al. ................. | 365/230.03 |
| 5,025,421 | 6/1991 | Cho .................................... | 365/230.05 |
| 5,079,693 | 1/1992 | Miller ...................................... | 395/250 |
| 5,157,775 | 10/1992 | Sanger .................................... | 395/425 |
| 5,226,009 | 7/1993 | Arimoto ............................. | 365/189.04 |
| 5,226,147 | 7/1993 | Fujishima et al. ..................... | 395/425 |
| 5,249,282 | 9/1993 | Segers .................................... | 395/425 |

(List continued on next page.)

OTHER PUBLICATIONS

Hennessy et al., Network Topologies, Chapter 9.6, Computer Organization and Design, The Hardware/Softward Interface, Chapter 9, Multiprocessors, Morgan Kaufmann Publishers, Inc., 1998, pp. 736–739.

Katz, Case Study 4.7 An Eight–Input Barrel Shifter, Contemporary Logic Design, Chapter 4, Programmable and Steering Logic, The Benjamin/Cummings Publishing Company, Inc., 1994, pp. 224–229.

Goto et al., A 3.3–V 12–ns 16–Mb CMOS SRAM, IEEE Journal of Solid–State Circuits, vol. 27, No. 11, Nov. 1992, pp. 1490–1496.

Bursky, Triple–Port DRAM Fuels Graphic Displays, Design Innovation, Electronic Design, Apr. 30, 1987, pp. 53–54.

Drumm et al., Dual–Port Statis RAMs Can Remedy Contention Problems, Computer Design, Aug. 1984, pp. 145–151.

*Primary Examiner*—Son Mai
*Attorney, Agent, or Firm*—Myers Bigel Sibley & Sajovec

[57] ABSTRACT

Tri-port memory buffers having fast fall-through capability contain a custom tri-port memory array of moderate capacity having nonlinear columns of tri-port cells therein which collectively form four separate registers, and a substantially larger capacity supplemental memory array (e.g., DRAM array) having cells therein with reduced unit cell size. In particular, a preferred tri-port memory array is provided having a read port, a write port and a bidirectional input/output port. The tri-port memory array communicates internally with the supplemental memory array via the bidirectional input/output port and communicates with external devices (e.g., peripheral devices) via the read and write data ports. Efficient steering circuitry is also preferably provided as a bidirectional crosspoint switch to electrically couple terminals (lines IO and IOB) of the bidirectional input/output port in parallel to bit lines (BL and BLB) in the supplemental memory array during a write-to-memory time interval and vice versa during a read-from-memory time interval. Circuitry is also preferably provided for controlling operation of the tri-port and supplemental memory arrays so that to the outside world the buffer memory device appears to have all the capacity of the large and highly integrated supplemental memory array, and all the most preferred features and functionality such as extremely fast fall-through capability of conventional dual-port buffer memory devices of more limited capacity.

29 Claims, 8 Drawing Sheets

U.S. PATENT DOCUMENTS

| | | | |
|---|---|---|---|
| 5,269,009 | 12/1993 | Herzl et al. | 395/425 |
| 5,276,842 | 1/1994 | Sugita | 395/425 |
| 5,280,441 | 1/1994 | Wada et al. | 365/63 |
| 5,305,274 | 4/1994 | Proebsting | 365/222 |
| 5,325,487 | 6/1994 | Au et al. | 395/250 |
| 5,365,485 | 11/1994 | Ward et al. | 365/221 |
| 5,371,708 | 12/1994 | Kobayashi | 365/221 |
| 5,396,460 | 3/1995 | Harada et al. | 365/189.01 |
| 5,471,583 | 11/1995 | Au et al. | 395/250 |
| 5,479,527 | 12/1995 | Chen | 382/232 |
| 5,487,049 | 1/1996 | Hang | 365/221 |
| 5,499,344 | 3/1996 | Elnashar et al. | 395/250 |
| 5,513,318 | 4/1996 | van de Goor et al. | 395/185.01 |
| 5,519,344 | 5/1996 | Proebsting | 327/108 |
| 5,524,265 | 6/1996 | Balmer et al. | 395/800 |
| 5,541,883 | 7/1996 | Devanney | 365/201 |
| 5,544,104 | 8/1996 | Chauvel | 365/189.01 |
| 5,546,338 | 8/1996 | Proebsting | 365/181 |
| 5,546,347 | 8/1996 | Ko et al. | 365/221 |
| 5,546,569 | 8/1996 | Proebsting et al. | 395/550 |
| 5,561,781 | 10/1996 | Braceras et al. | 395/458 |
| 5,568,443 | 10/1996 | Dixon et al. | 365/230.05 |
| 5,568,495 | 10/1996 | Laczko Sr. et al. | 371/471 |
| 5,572,471 | 11/1996 | Proebsting | 365/200 |
| 5,576,560 | 11/1996 | Runaldue et al. | 257/208 |
| 5,585,747 | 12/1996 | Proebsting | 327/55 |
| 5,586,299 | 12/1996 | Wakerly | 395/476 |
| 5,596,540 | 1/1997 | Diem et al. | 365/221 |
| 5,602,780 | 2/1997 | Diem et al. | 365/189.01 |
| 5,603,009 | 2/1997 | Konishi et al. | 395/492 |
| 5,608,685 | 3/1997 | Johnson et al. | 365/230.06 |
| 5,642,318 | 6/1997 | Knaack et al. | 365/201 |
| 5,649,232 | 7/1997 | Bourekas et al. | 395/880 |
| 5,663,910 | 9/1997 | Ko et al. | 365/189.05 |
| 5,671,393 | 9/1997 | Yamaki et al. | 395/477 |
| 5,682,356 | 10/1997 | Knaack | 365/236 |
| 5,712,820 | 1/1998 | Knaack | 365/189.02 |
| 5,715,197 | 2/1998 | Nance et al. | 365/189.02 |
| 5,732,041 | 3/1998 | Joffe | 365/230.05 |
| 5,751,638 | 5/1998 | Mick et al. | 365/189.04 |
| 5,764,967 | 6/1998 | Knaack | 395/555 |
| 5,777,944 | 7/1998 | Knaack et al. | 365/230.06 |
| 5,829,015 | 10/1998 | Maeno | 711/104 |
| 5,852,608 | 12/1998 | Csoppenszky et al. | 711/149 |

FIG. 3

BUFFER MEMORY ARRAYS HAVING NONLINEAR COLUMNS FOR PROVIDING PARALLEL DATA ACCESS CAPABILITY AND METHODS OF OPERATING SAME

CROSS-REFERENCE TO RELATED APPLICATIONS

This application is related to application Ser. No. 09/082,855, entitled "HIGHLY INTEGRATED TRI-PORT MEMORY BUFFERS HAVING FAST FALL-THROUGH CAPABILITY AND METHODS OF OPERATING SAME" (Attorney Docket No. 5646-11); application Ser. No. 09/082,856, entitled "INTEGRATED CIRCUIT MEMORY DEVICES HAVING PARTITIONED MULTI-PORT MEMORY ARRAYS THEREIN FOR INCREASING DATA BANDWIDTH AND METHODS OF OPERATING SAME" (Attorney Docket No. 5646-13); and application Ser. No. 09/082,893, entitled "METHODS OF CONTROLLING MEMORY BUFFERS HAVING TRI-PORT CACHE ARRAYS THEREIN" (Attorney Docket No. 5646-15), filed concurrently herewith, the disclosures of which are hereby incorporated herein by reference.

FIELD OF THE INVENTION

The present invention relates to integrated circuit memory devices and methods of operating same, and more particularly to buffer memory devices and methods of operating buffer memory devices.

BACKGROUND OF THE INVENTION

Semiconductor memory devices can typically be classified on the basis of memory functionality, data access patterns and the nature of the data storage mechanism. For example, distinctions are typically made between read-only memory (ROM) devices and read-write memory (RWM) devices. The RWM devices typically have the advantage of offering both read and write functionality with comparable data access times. Typically, in RWM devices, data is stored either in flip-flops for "static" memory devices or as preset levels of charge on a capacitor in "dynamic" memory devices. As will be understood by those skilled in the art, static memory devices retain their data as long as a supply of power is maintained, however, dynamic memory devices require periodic data refreshing to compensate for potential charge leakage. Because RWM devices use active circuitry to store data, they belong to a class of memory devices known as "volatile" memory devices because data stored therein will be lost upon termination of the power supply. ROM devices, on the other hand, may encode data into circuit topology (e.g., by blowing fuses, removing diodes, etc.). Since this latter type of data storage may be hardwired, the data cannot be modified, but can only be read. ROM devices also typically belong to a class of memory devices known as "nonvolatile" memory devices because data stored therein will typically not be lost upon termination of the power supply. Other types of memory devices that have been more recently developed are typically referred to as nonvolatile read-write (NVRWM) memory devices. These types of memory devices include EPROM (erasable programmable read-only memory), $E^2PROM$ (electrically erasable programmable read-only memory), and flash memories, for example.

An additional memory classification is typically based on the order in which data can be accessed. Here, most memory devices belong to the random-access class, which means that memory locations can be read from or written to in random order. Notwithstanding the fact that most memory devices provide random-access, typically only random-access RWM memories use the acronym RAM. Alternatively, memory devices may restrict the order of data access to achieve shorter data access times, reduce layout area and/or provide specialized functionality. Examples of such specialized memory devices include buffer memory devices such as first-in first-out (FIFO) memory devices, last-in first-out (LIFO or "stack") memory devices, shift registers and content-addressable memory (CAM) devices.

A final classification of semiconductor memories is based on the number of data input and data output ports associated with the memory cells therein. For example, although most memory devices have unit cells therein that provide only a single port which is shared to provide an input and output path for transfer of data, memory devices with higher bandwidth requirements often have cells therein with multiple input and output ports. However, the addition of ports to unit memory cells typically increases the complexity and layout area requirements for these higher bandwidth memory devices.

Single-port memory devices are typically made using static RAM cells if fast data access times are a requirement, and dynamic RAM cells if low cost is a primary requirement. Many FIFO memory devices use dual-port RAM based designs with self-incrementing internal read and write pointers to achieve fast fall-through capability. As will be understood by those skilled in the art, fall-through capability is typically measured as the time elapsing between the end of a write cycle into a previously empty FIFO and the time an operation to read that data may begin. Exemplary FIFO memory devices are more fully described and illustrated at section 2.2.7 of a textbook by A. K. Sharma entitled "Semiconductor Memories: Technology, Testing and Reliability", IEEE Press (1997).

In particular, dual-port SRAM-based FIFOs typically utilize separate read and write pointers to advantageously allow read and write operations to occur independently of each other and achieve fast fall-through capability since data written into a dual-port SRAM FIFO can be immediately accessed for reading. Since these read and write operations may occur independently, independent read and write clocks having different frequencies may be provided to enable the FIFO to act as a buffer between peripheral devices operating at different rates. Unfortunately, a major disadvantage of typical dual-port SRAM-based FIFOs is the relatively large unit cell size for each dual-port SRAM cell therein. Thus, for a given semiconductor chip size, dual-port buffer memory devices typically provide less memory capacity relative to single-port buffer memory devices. For example, using a standard DRAM cell as a reference unit cell consuming one (1) unit of area, a single-port SRAM unit cell typically may consume four (4) units of area and a dual-port SRAM unit cell typically may consume sixteen (16) units of area. Moreover, the relatively large unit cells of a dual-port SRAM FIFO limit the degree to which the number of write operations can exceed the number of read operations, that is, limit the capacity of the FIFO.

To address these limitations of dual-port buffer memory devices, single-port buffer memory devices have been developed to, among other things, achieve higher data capacities for a given semiconductor chip size. For example, U.S. Pat. No. 5,546,347 to Ko et al. entitled "Interleaving Architecture And Method For A High Density FIFO", assigned to the present assignee, discloses a preferred memory device which has high capacity and uses relatively small single-port memory cells. However, the use of only single port memory cells typically precludes simultaneous read and write access to data in the same memory cell which means that single-port buffer memory devices typically have slower fall-through time than comparable dual-port memory devices. Moreover, single-port buffer memory devices may use complicated arbitration hardware to control sequencing and queuing of reading and writing operations.

U.S. Pat. No. 5,371,708 to Kobayashi also discloses a FIFO memory device containing a single-port memory array, a read data register for holding read data from the memory array and a write data register for holding write data to the memory array. A bypass switch is also provided for transferring data from the write data register to the read data register so that the memory array can be bypassed during testing of the FIFO to detect the presence of defects therein. However, like the above-described single-port buffer memory devices, simultaneous read and write access to data is not feasible.

Thus, notwithstanding the above described buffer memory devices, there still exists a need to develop high speed buffer memory devices having expanded functionality, increased data capacity and reduced unit cell size.

SUMMARY OF THE INVENTION

It is therefore an object of the present invention to provide improved buffer memory devices that can have reduced cost and expanded functionality, and methods of operating same.

It is a further object of the present invention to provide highly integrated buffer memory devices having memory cells therein that can have reduced lateral dimensions, and methods of operating same.

It is another object of the present invention to provide buffer memory devices that can have expanded memory capacity, and methods of operating same.

It is another object of the present invention to provide buffer memory devices that can have fast fall-through capability, and methods of operating same.

It is still another object of the present invention to provide buffer memory devices having simultaneous read and write capability, and methods of operating same.

These and other objects, advantages and features of the present invention are provided by buffer memory devices (e.g., first-in first-out (FIFO) memory devices) which contain a custom multi-port memory array of moderate capacity and a substantially larger capacity supplemental memory array having cells therein with reduced unit cell size, and methods of operating same. According to one embodiment of the present invention, a preferred tri-port memory array is provided having a read port, a write port and a bidirectional input/output port. In this embodiment, the tri-port memory array is electrically coupled to the highly integrated and substantially larger capacity supplemental memory array (e.g., DRAM array) which may contain a plurality of columns and rows of single-port memory cells therein. The tri-port memory array communicates internally with the supplemental memory array via the bidirectional input/output port and communicates with external devices (e.g., peripheral devices) via the write and read data ports and input/output driver circuits coupled to the write and read data ports.

Efficient steering circuitry is also preferably provided as a bidirectional crosspoint switch to electrically couple terminals (lines IO and IOB (i.e., $\overline{IO}$)) of the bidirectional input/output port of the tri-port memory array in parallel to bit lines (BL and BLB (i.e., $\overline{BL}$)) in the supplemental memory array during a write-to-memory time interval and during a read-from-memory time interval. Circuitry is also preferably provided for controlling operation of the tri-port and supplemental memory arrays so that to the outside world the buffer memory device appears to have all the capacity of the large and highly integrated supplemental memory array, and all the features and functionality of a conventional dual-port-cell based buffer memory device (typically having much more limited capacity), such as extremely fast fall-through capability. In addition, the tri-port memory array is preferably designed as a plurality of separate registers of tri-port cells (e.g., registers A, B, C and D) and each register is preferably arranged as a plurality of nonlinear columns (e.g., serpentine-shaped or louvered-shaped columns) of tri-port cells.

According to a preferred aspect of the present invention, the arrangement of each register as a plurality of nonlinear columns of tri-port cells enables highly efficient parallel/serial transfer of data back and forth between all cells in a row of memory cells in the supplemental memory array and all columns in a selected register of tri-port cells. According to another preferred aspect of the present invention, a minimum of four registers is provided in the tri-port memory array so that there is always a current read register, an immediately available next-to-read register, a current write register and an immediately available next-to-write register. In particular, the use of four separate registers and efficient steering circuitry eliminates the possibility that gaps or stoppages will occur in the flow of data into and out of the buffer memory device during write and read operations, unless full or empty, respectively. Accordingly, by always maintaining a source of available read data, the present invention can be operated to emulate dual-port FIFOs with substantially reduced layout area requirements.

Moreover, a preferred arrangement of the tri-port memory array and steering circuitry enables the parallel transfer of a plurality of bits (e.g., 3 bits) of data from all columns of tri-port cells in a selected register thereof (e.g., A or B or C or D) to a row of memory cells in the supplemental memory array during a respective portion of the write-to-memory time interval and vice versa during a respective portion of the read-from-memory time interval. Using a sequence of consecutive parallel transfer operations, it is also possible to obtain parallel/serial transfer of all bits of data (e.g., 18 bits) from each of the columns in a selected register in the tri-port memory array to the supplemental memory array and vice versa with reduced layout wiring penalty. This advantage may be achieved even if the columns of tri-port cells in the registers are aligned in a generally orthogonal direction relative to a row of memory cells in the supplemental memory array. In addition, corresponding columns of tri-port cells in each register are aligned together in side-by-side relation to, among other things, improve integration density and reduce the complexity of the steering circuitry.

According to yet another preferred aspect of the present invention, the memory cells in the supplemental memory array may comprise dynamic random access memory (DRAM) cells having very substantially reduced unit cell size compared to the unit cell size of a conventional dual-port buffer memory device (e.g., dual-port FIFO) having dual-port SRAM cells therein. Here, the ratio of the number of memory cells in the supplemental memory array (e.g., DRAM array) relative to the number of potentially significantly larger tri-port cells (e.g., tri-port SRAM cells) is made so high that the total size of the supplemental memory cells and tri-port cells is only slightly greater than that of the supplemental memory array alone. For example, according to the preferred embodiment of the present invention having four (4) tri-port registers, the supplemental memory array may be designed to contain 2048 rows ×2304 columns=4, 718,592 DRAM cells. The tri-port memory array may be designed to contain 4×18×128=9216 tri-port cells. Thus, even if the unit cell size of a tri-port cell (e.g., SRAM tri-port cell) were to be thirty two (32) times as large as the unit cell size of a single DRAM cell, the total area of DRAM and tri-port cells would only be 6.25% greater than the total area of the DRAM cells alone. Therefore, the present invention may consume a total area which is approximately equal to a conventional DRAM device of equal capacity. However, to the outside world, the present invention provides a sequential buffer memory device with the most preferred features of a current state-of-the-art dual-port-cell based buffer memory device, yet requires only a fraction of the area.

Another embodiment of the present invention provides methods of operating buffer memory devices which include the steps of writing first data from external to the buffer memory device into a first register within a tri-port memory array having a read port, a write port and a bidirectional input/output port. This step may be performed at a maximum write rate during burst write mode operation to fill the first register during a minimum write-to-register time interval. This minimum write-to-register time interval typically has a duration that is a function of the depth of the first register and the write cycle frequency, among other things. For example, assuming a 10 ns minimum duration for writing a 36 bit word of data (as two 18 bit half-words) into a register having a capacity of 18 bits×128 words (i.e., 2304 bits), a minimum write-to-register time interval of 640 ns would typically apply. Then, a step may be performed to transfer all of the first data from the first register to an internal supplemental memory array during a write-to-memory time interval. Preferably, the duration of the write-to-memory time interval is less than about one half the duration of the minimum write-to-register time interval if the supplemental memory array contains SRAM cells or is less than about one third the duration of the minimum write-to-register time interval if the supplemental memory array contains DRAM cells (which require refresh). This transfer step is typically performed while additional write data is being written into another register in the tri-port memory array.

For example, using the above described steering circuitry, the entire contents of the first register may be transferred via the bidirectional input/output port to a single row of memory cells in the supplemental memory array. According to a preferred aspect of this transfer step, 384 bits of data may be transferred in parallel during each of six (6) consecutive time intervals within the write-to-memory time interval. To enable the data in the supplemental memory array to be read, a step will also be performed to transfer the first data from the row of memory cells in the supplemental memory array back into the tri-port memory array, during a read-from-memory time interval which may have duration about equal to the write-to-memory time interval. In the event the tri-port memory array contains four (4) registers of tri-port cells, this step of transferring the first data out of the row of memory cells may include the step of transferring parallel packets of the first data into a second register (or back into the first register) during each of six (6) consecutive time intervals within the read-from-memory time interval. Finally, a step may be performed to read the first data in a first-in first-out sequence from the second register, during a read-from-register time interval. This step may be performed at a maximum rate during burst read mode operation to read the second register during a minimum read-from-register time interval which typically equals the minimum write-to-register time interval.

According to a further preferred aspect of the present invention, the supplemental memory array is a dynamic random access memory array and each row of cells therein may be periodically refreshed during a respective refresh cycle which preferably has a duration less than or equal to the duration of the read-from-memory or write-to-memory time interval. In particular, to always maintain a source of available read data even under worst case operating conditions and achieve other advantages, the sum of the durations of a refresh cycle, the write-to-memory time interval and the read-from-memory time interval is preferably less than the duration of the minimum write-to-register time interval or minimum read-from-register time interval. Thus, the capacities and dimensions of the registers and the supplemental memory array can be optimally chosen based on the design rules of a particular implementation technology to achieve a buffer memory device having extremely high capacity with reduced chip dimensions, wide data width operation, very low latency operation and extremely fast read and write cycle times.

BRIEF DESCRIPTION OF THE DRAWINGS

FIG. 3 is a block layout schematic that illustrates an alternative tri-port memory array containing four registers of tri-port memory cells arranged as a plurality of louvered-shaped columns of memory cells, according to a second embodiment of the present invention.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
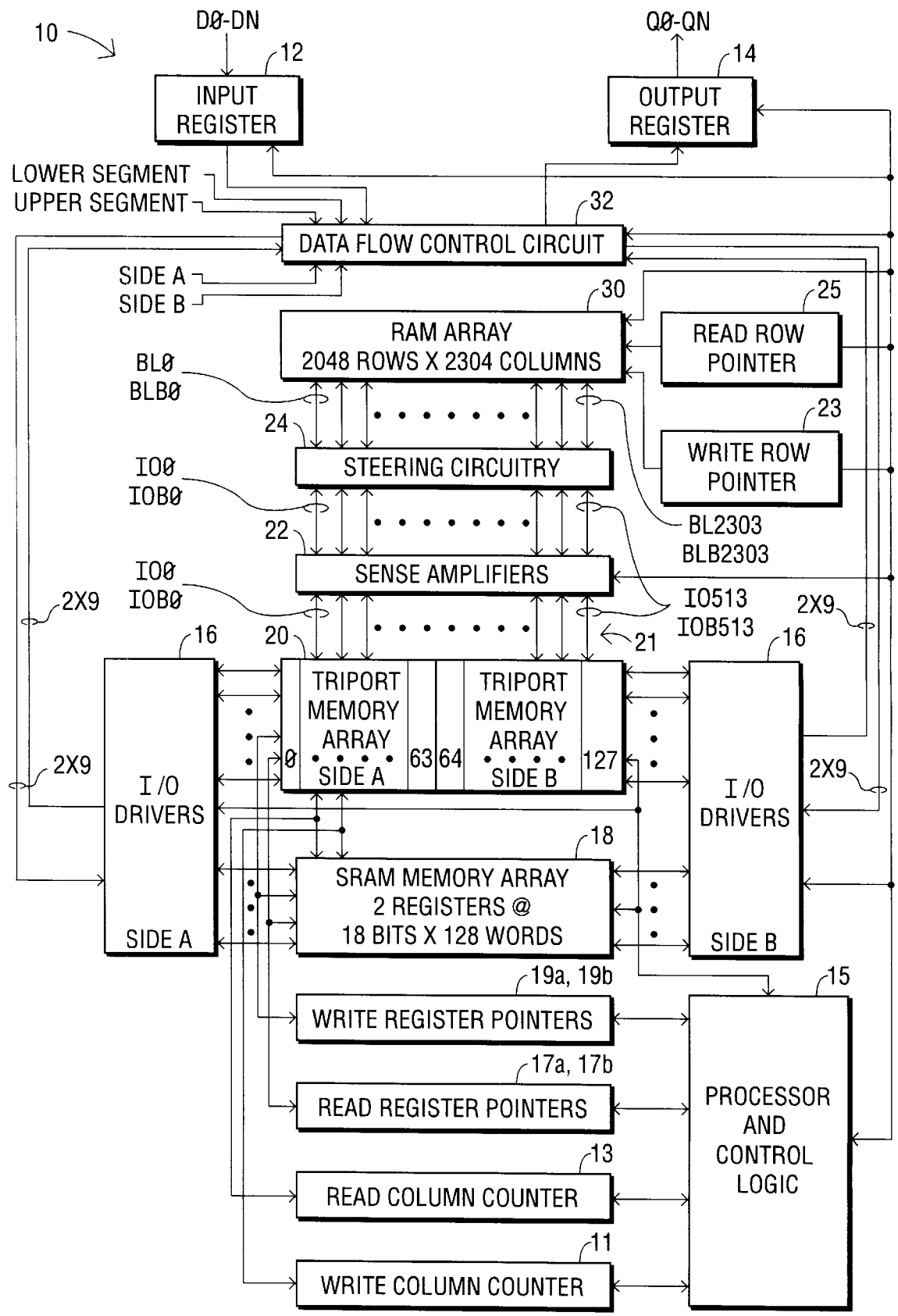
FIG. 1 is a block diagram of a first-in first-out (FIFO) buffer memory device according to a first embodiment of the present invention.

Referring now to FIG. 1, a preferred buffer memory device 10 according to a first embodiment of the present invention is illustrated. In this device 10, an input register 12 may be provided as an interface register so that input data (D0–Dn) to be written into the buffer memory device 10 can be supplied from an external peripheral device in a preferred parallel format. In particular, the input register 12 may be a 9-bit, 18-bit or 36-bit input register, for example, so that binary words or portions thereof may be simultaneously loaded into the buffer memory device 10. Similarly, an output register 14 may be provided as an interface register so that output data (Q0–Qn) to be read from the buffer memory device 10 can be supplied to an external peripheral device. As will be understood by those skilled in the art, in the event the buffer memory device 10 is embodied as an integrated circuit on a semiconductor chip, the input and output registers may be electrically connected to respective input and output pads (not shown) on the semiconductor chip.

As illustrated, the input register 12 and output register 14 may be electrically coupled by a multi-bit bus to a data flow control circuit 32. The data flow control circuit 32 is also electrically coupled via a plurality of multi-bit buses to a pair of input/output (I/O) driver circuits 16. These input/output driver circuits 16 may comprise read and write drivers and sense amplifiers for transferring data to and from a dual-port or single-port memory array 18 (e.g., SRAM array) containing two registers therein (to support a retransmit function if needed), and a tri-port memory array 20 (e.g., tri-port SRAM array) containing four tri-port registers (A,B,C and D) therein. According to a preferred aspect of the present invention, each of the tri-port registers may have the capacity of retaining 64 words of 36 bit data (i.e., 2304 bits) in columns containing 18 tri-port SRAM cells each. Here, the term "tri-port" is used to describe a memory cell or array thereof having at least three ports. This capacity may also be preferably configured as 256 words of 9 bit data or 128 words of 18 bit data, for example. In particular, in the event 36 bit words are used, improved writing and reading performance can be achieved by utilizing both input/output driver circuits 16 to simultaneously write or read the 18 bit LSB and 18 bit MSB portions of the 36 bit word into and from the tri-port memory array 20 during a single write or read clock cycle.

According to a preferred aspect of present invention, the data flow control circuit 32 contains a crosspoint switch for facilitating bidirectional routing of data between the input and output registers 12 and 14 and the first and second input/output driver circuits 16 via the plurality of multi-bit (e.g., 9-bit) buses. As illustrated, the data flow control circuit 32 is responsive to lower and upper segment signals and side A and side B select signals. In particular, in the event the buffer memory device 10 is configured by a user or manufacturer to handle 36-bit input words, the lower and upper segment signals and side A and side B select signals may be generated internally by a processor and control logic circuit 15. These signals may be used to route an 18-bit LSB portion of each 36-bit word received by the input register 12 to the "SIDE A" input/output driver circuit 16 (using two 9-bit buses) in parallel with the routing of an 18-bit MSB portion of each 36-bit word to the "SIDE B" input/output driver circuit 16. The lower and upper segment signals may also be used to control routing of lower and upper segments of each 18-bit portion of the data input word into lower (or upper) and upper (or lower) portions of each column of memory cells in the tri-port memory array 20, by selectively routing the lower and upper segments of each 18 bit portion of the data input word to a particular 9-bit bus using multiplexers internal to the data flow control circuit 32.

This aspect of the data flow control circuit 32 can be particularly useful for users wanting to preserve or reconfigure data in big "endian" or little "endian" format during a write operation, and may also eliminate the need to multiplex output data being read from the tri-port memory array 20, using multiplexers that are serially connected in the output paths and could provide additional delay during reading operations. Here, as will be understood by those skilled in the art, the term "endian" refers to the particular placement of bytes within a word of data. For example, in the event the memory device 10 is configured to enable writing of 9-bit words and reading of 18-bit words, the lower and upper segment signals may be utilized to control routing of two 9-bit input words into lower and upper portions of a single column of tri-port cells in the tri-port memory array 20 during consecutive write clock cycles so that 18-bit words can be retrieved directly (in the user selected little or big "endian" format) during read operations which require only one read clock cycle for each 18 bit word that is read.

As described more fully hereinbelow, the tri-port memory array 20 includes a bidirectional input/output port 21 that is electrically coupled to a supplemental single-port memory array 30 (e.g., DRAM or SRAM array). Based on the above described capacity for each tri-port register of 128 words of 18 bit data, the bidirectional input/output port may be preferably configured as 514 tri-port terminals. Each tri-port terminal is comprised of a pair of input/output lines IO and IOB (i.e., ($IO_0$, $IOB_0$), . . . , ($IO_{513}$, $IOB_{513}$)). An array 22 of sense amplifiers (e.g., linear array of 514 sense amplifiers) is also electrically coupled at a first end to the bidirectional input/output port, as illustrated. As will be understood by those skilled in the art, precharge and line equalization circuits (not shown) may be provided to set each input/output line $IO_n$ and complementary input/output line $IOB_n$ at the same potential (e.g., Vdd, ½Vdd) just prior to performance of a sense operation for determining the relative differential states of the input/output line pairs upon application of data thereto and then driving the lines in a pair to opposing rail voltages (e.g., Vss and Vdd). To reduce excessive power consumption caused by unnecessary charging of input/output lines being sensed, the array 22 of sense amplifiers preferably includes multiplexer circuits to isolate the input/output lines on one side of the array 22 when the input/output lines on the other side are being driven rail-to-rail. Thus, when a slight differential potential is established across a respective input/output line pair $IO_n$ and $IOB_n$ on the side of the tri-port memory array 20 (i.e., the "sensed" side) during an operation to transfer tri-port data to the supplemental memory array 30, the respective input/output lines on the side of the steering circuitry 24 are driven rail-to-rail but the corresponding input/output lines on the sensed side are allowed to float. Similarly, when a slight differential potential is established across a respective input/output line pair $IO_n$ and $IOB_n$ on the side of the steering circuitry 24 during an operation to fetch data from the supplemental memory array 30, the respective input/output lines on the tri-port side of the array 22 are driven rail-to-rail but the lines being sensed are allowed to float.

Preferred steering circuitry 24, in the form of a crosspoint switch, is also electrically coupled between a second end of the array 22 of sense amplifiers and the supplemental memory array 30. As described more fully hereinbelow, the crosspoint switch contains multiplexer and demultiplexer circuits therein to selectively route a reduced number of pairs of input/output lines IO and IOB at the bidirectional input/output port to a greater number of pairs of bit lines BL and BLB in the supplemental memory array 30 and vice versa, in response to register transfer and column select signals. Each of these pairs of bit lines BL and BLB may be electrically coupled to a respective column of memory cells in the supplemental memory array 30. As illustrated, the preferred steering circuitry 24 may be provided for routing 514 pairs of input/output lines to 2304 pairs of bit lines in the supplemental memory array 30 containing 2K rows (K=1024). These 2K rows of memory cells may be formed by grouping together eight (8) blocks of memory having 256 rows each, for example. Moreover, by routing data input/output lines numbering less than one-quarter the number of bit lines, the substantially greater layout pitch requirements of the input/output lines IO and IOB (relative to the layout pitch of the bit lines BI and BLB) can be accommodated. As described more fully hereinbelow, 384 complementary pairs of bidirectional data lines communicate to or from the supplemental memory array 30. In the preferred embodiment, these lines pass directly over the eight (8) blocks of memory in the top layer of metal interconnect, parallel to the bit lines in the supplemental memory array 30.

Referring still to FIG. 1, processor and control logic 15 is also provided for controlling operation of the above-described circuits. Among other things, the control logic 15 provides information generated by a number of counters and pointers to control operation of the buffer memory device 10 as a sequential buffer memory device (e.g., FIFO, LIFO). The control logic 15 may provide information such as (1) write register pointers 19a, 19b which may designate a current write register and a next-to-write register in the tri-port memory array 20, respectively, (2) a write-column counter 11 which designates a column of tri-port memory cells in the current write register receiving current write data, (3) read register pointers 17a, 17b which may designate a current read register and a next-to-read register in the tri-port memory array 20, respectively, (4) a read-column counter 13 which designates a column of tri-port memory cells in the current read register from which current read data is being read, (5) a read row counter/pointer 25 which may point to a row in the supplemental memory array 30 that contains data to be loaded into the next-to-read register, and (6) a write row counter/pointer 23 which may point to a row in the supplemental memory array 30 which is to receive data in the current write register.

In contrast to the tri-port memory array 20 which is electrically coupled to the supplemental memory array 30, the dual-port or single-port memory array 18, which need not be coupled to the supplemental memory array 30, may be operated as a retransmit memory buffer so that a retransmit-from-mark operation may begin with zero cycle latency. In particular, the single or dual-port memory array 18 may contain data which immediately follows data that was marked during reading or writing operations. Then, upon receipt of a retransmit-from-mark request by a user, the retransmit data in the memory array 18 may be immediately read while operations are simultaneously performed to transfer additional retransmit data from the supplemental memory array 30 to the tri-port memory array 20. This additional retransmit data can then be read from the tri-port memory array 20 once all the data in the single or dual-port memory array 18 has been read.

Figure 2:
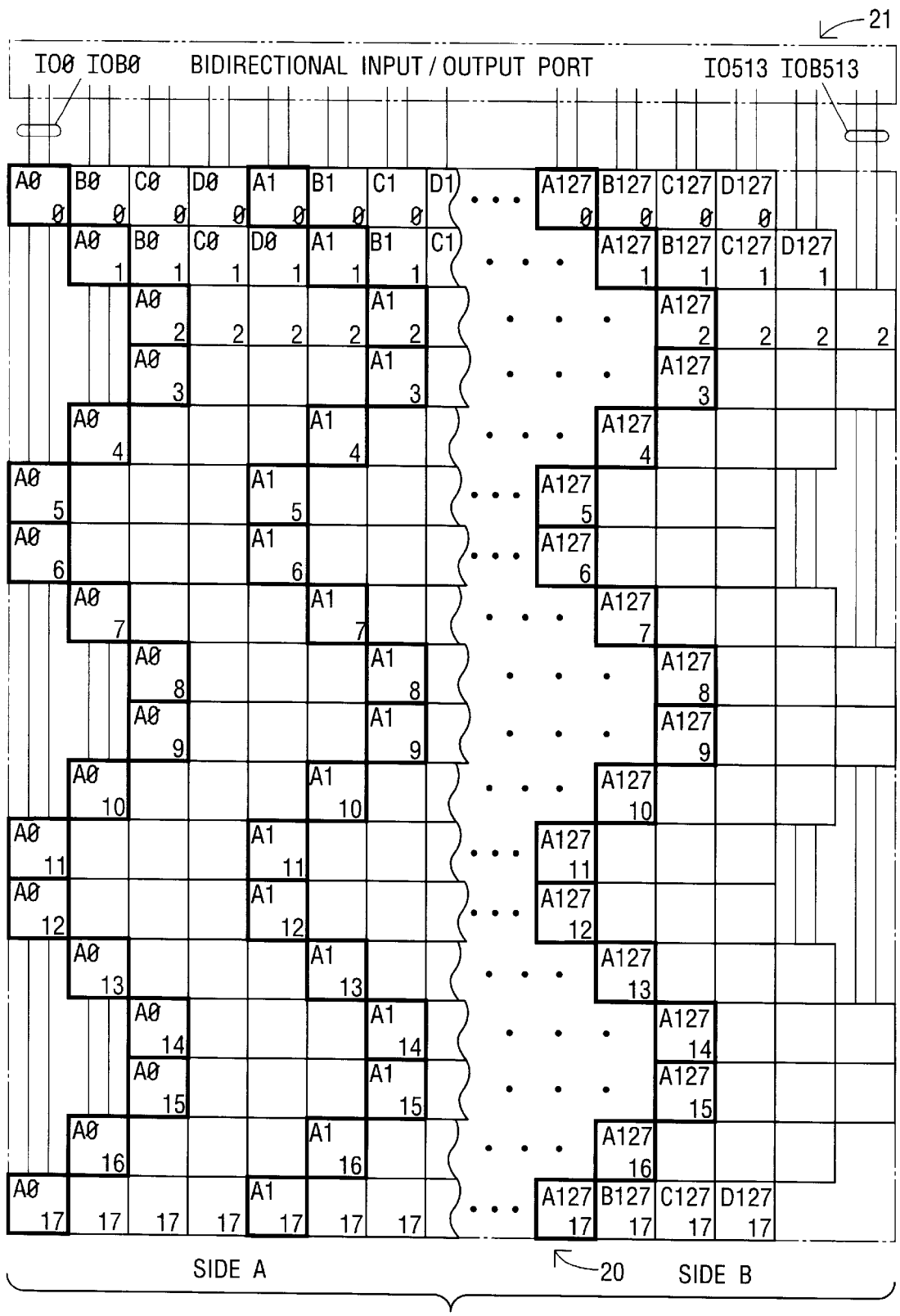
FIG. 2 is a block layout schematic that illustrates a preferred tri-port memory array containing four registers of tri-port memory cells arranged as a plurality of serpentine-shaped columns of memory cells, according to the first embodiment of the present invention.
Figure 6:
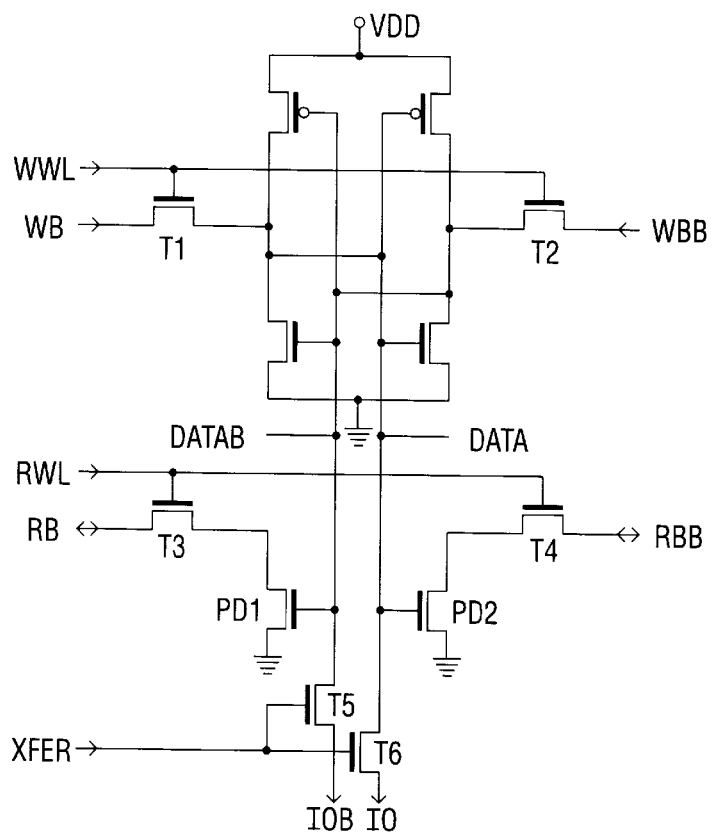
FIG. 6 is an electrical schematic of a tri-port cell of FIG. 4.

Referring now to FIG. 2, a block layout schematic is provided to illustrate a preferred tri-port memory array 20 containing four registers (A,B,C and D) of tri-port memory cells. The tri-port memory cells may comprise tri-port SRAM cells, as illustrated by FIG. 6, and each register may comprise a plurality of spaced nonlinear columns of tri-port memory cells. In particular, each register may comprise a plurality (e.g., 128) of serpentine-shaped (e.g., zig-zag shaped) columns of tri-port SRAM memory cells, although other shapes of linear or nonlinear columns may also be used. As described more fully hereinbelow, the arrangement of each register as a plurality of nonlinear columns of tri-port cells can enable highly efficient parallel/serial transfer of data back and forth between a row(s) of memory cells in the supplemental memory array 30 and each register of tri-port cells. A minimum of four registers is also preferably provided in the tri-port memory array 20 so that there is always a current read register (selected by the read register pointer 17a), one of whose columns is currently selected by a read column counter 13, an immediately available next-to-read register to which the read register pointer will advance after all columns of the presently selected read register have been read, a current write register (selected by the write register pointer 19a), one of whose columns is currently selected by a write column counter 11 and an immediately available next-to-write register to which the write register pointer will advance after all columns of the presently selected write register have been written. In particular, the use of four (4) separate registers and efficient steering circuitry 24 eliminates the possibility that gaps or stoppages will occur in the flow of data into and out of the buffer memory device 10 during worst case read and write operations which may include simultaneous burst-mode read and write operations.

These and other preferred aspects of the present invention are more fully described in copending and commonly assigned U.S. application Ser. No. 08/082,893, entitled "Methods of Controlling Memory Buffers Having Tri-Port Cache Arrays Therein" (Attorney Docket No. 5646-15), the disclosure of which is hereby incorporated herein by reference. In particular, the operation of the preferred buffer memory device may include the steps of writing 64 words of 36 bit data into a current write register (e.g., register A) in the tri-port memory array 20. These 64 words may be written during 64 consecutive write clock cycles and, during each clock cycle, each 36 bit word may be simultaneously written by the left and right side input/output driver circuits 16 as two groups of 18 bits each. Once the current write register is full, a new current write register (e.g., register B) can be defined to receive additional write data without interruption. Sometime after completely filling all columns of the current write register, but before completely filling the next-to-write register (i.e., the "new" current write register), the entire 2304 bits of write data in the former current write register can be transferred via the bidirectional input/output port 21 to a row of memory cells in the supplemental memory array 30, during a write-to-memory time interval. The row is selected by the write row pointer 23. This transfer step can be performed during six consecutive portions of a write-to-memory time interval, by using the preferred steering circuitry 24 to enable parallel transfer of 384 bits of data during each of the portions of the write-to-memory time interval. For example, 3 bits of data from each of the 128 columns of tri-port cells in the former current write register can be simultaneously transferred to the supplemental memory array 30. The remaining fifteen (15) bits of each column of tri-port cells are transferred during five (5) consecutive portions of the write-to-memory time interval.

While data is being read from a current read register (e.g., register C) in the tri-port memory array 20 during a read-from-register time interval, the next 2304 bits of data to be read from the device 10 are transferred from the row of memory cells (selected by the read row pointer 25) in the supplemental memory array 30 to a next-to-read register (e.g., register D) in the tri-port memory array 20, during six consecutive portions of a read-from-memory time interval. This data can then be read from the tri-port memory array 20 once the current read register has been emptied. Here, the fact that the write and read registers may be different is totally transparent to the user.

Because of the highly efficient manner in which data is transferred to and from the supplemental memory array 30 as a series of large parallel packets of data, current and next-to-write registers and current and next-to-read registers (i.e., four (4) registers) can always be made available in the tri-port memory array 20 so that gaps or stoppages in the flow of read and write data can be prevented even under worst case burst mode operation. Here, each register in the tri-port memory array 20 is sized so that even if data is being read from a current read register in the tri-port memory array 20 at a maximum read rate, it will always be possible (unless the supplemental memory array 30 is full) to sequentially transfer previously written data from a register in the tri-port memory array 20 to the supplemental memory array 30, perform an operation to refresh the supplemental memory array 30, if necessary, and then transfer data back to an available register in the tri-port memory array 20 to make it available for reading, before the current read register has been emptied so that no gap in the flow of data occurs. Thus, it is the capacity of the supplemental memory array 30 which determines when the buffer memory device 10 of the present invention is full, yet it is the tri-port registers which provide the fast fall-through access associated with conventional dual-port buffer memory devices. Note that when almost empty, the current read and write register pointers 17a and 19a both point to the same tri-port register A, B, C or D (unless the current write register pointer has just transitioned to the "new" write register which will be the next-to-read register defined by the next-to-read register pointer 17b). Thus, when the memory device 10 is almost empty, the tri-port register acts as a normal dual-port register providing very fast fall-through time from the time of writing data to the time of reading the same data. The supplemental memory array plays no role in this almost empty condition.

Figure 3:
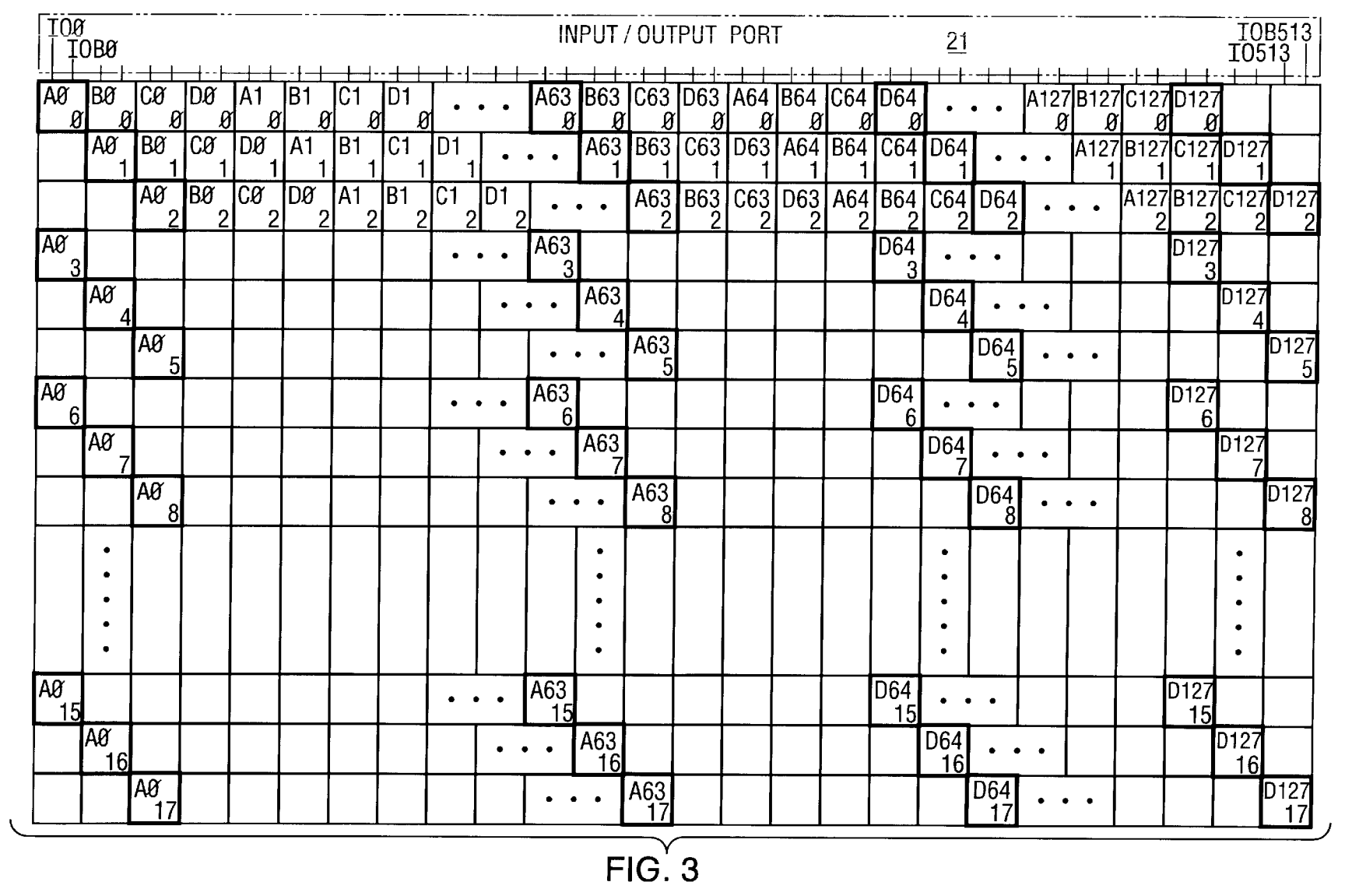

Referring still to FIG. 2, a first tri-port register (e.g., register A) may be defined by 128 serpentine-shaped columns A0–A127. In the first column A0 which is electrically coupled to the left side input/output driver circuit 16 of FIG. 1, cells 0–17 are aligned as a nonlinear column having three (3) cells for each of six (6) staggered segments which trace a zig-zag pattern. Columns 0 through 63 are electrically coupled to the left side input/output driver circuit 16. In column 64 which is electrically coupled to the right side input/output driver circuit 16 of FIG. 1, cells 0–17 are similarly aligned as a column having three (3) cells for each of six (6) staggered segments. In column 64 and higher columns, cells 0–17 may be aligned to provide the last 18 bits of a 36 bit word. According to the preferred embodiment, the first and second columns A0 and A1 of register A are also separated by three serpentine-shaped columns of cells from other registers. In particular, corresponding columns of each of the registers (e.g., A0,B0,C0 and D0) are grouped together as four closely adjacent columns. Alternatively, each register within the tri-port memory array 20 may be arranged as a plurality of louvered-shaped columns of memory cells containing six discontinuous segments (A0–A2, A3–A5, A6–A8, A9–A11, A12–A14, A15–A17), as illustrated best by FIG. 3.

Figure 4:
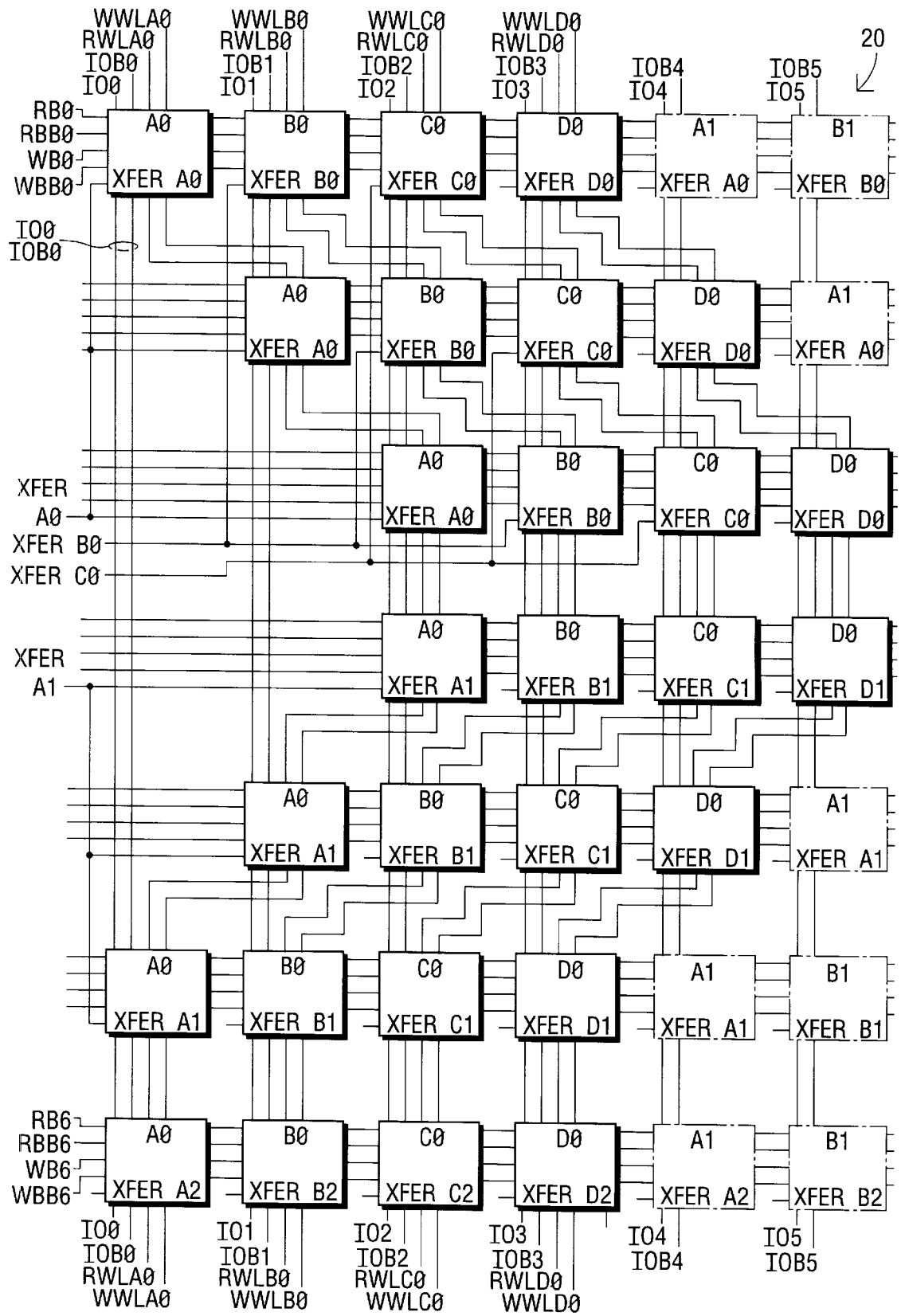
FIG. 4 is an electrical schematic that illustrates the electrical interconnections between tri-port cells 0–6 in columns A0, B0, C0 and D0, according to the tri-port memory array of FIG. 2.

Referring now to FIG. 4, an electrical schematic is provided to further illustrate the electrical interconnections between the tri-port cells 0–6 in columns A0, B0, C0 and D0 of FIG. 2. The other tri-port cells in the tri-port memory array 20 are similarly connected. In particular, read word lines (RWL) controlled by current read register pointer 17a and read column counter 13 and write word lines (WWL) controlled by current write register pointer 19a and write column counter 11 are provided as a pair of adjacent serpentine-shaped word lines for each nonlinear column of cells. For example, all 18 bits of column A0 of register A are responsive to read word line RWLA0 for data output and write word line WWLA0 for data input. These read and write word lines preferably trace a zig-zag pattern, as illustrated. Similarly, columns B0, C0 and D0 are responsive to their respective word lines: (RWLB0, WWLB0), (RWLC0, WWLC0) and (RWLD0, WWLD0). Pairs of parallel differential input/output lines (IO0, IOB0), (IO1, IOB1), (IO2, IOB2) and (IO3, IOB3) are also provided in a vertical direction. Each of these pairs of input/output lines comprises a terminal of the above-described bidirectional input/output port 21. According to the layout of cells illustrated by FIG. 2, lines IO0 and IOB0 span six (6) cells in column A0, lines IO1 and IOB1 span six (6) cells in each of columns B0 and A0, lines IO2 and IOB2 span six (6) cells in each of columns C0, B0 and A0, lines IO3 and IOB3 span six (6) cells in each of columns D0, C0 and B0, lines IO4 and IOB4 span six (6) cells in each of columns A1, D0 and C0 and lines IO5 and IOB5 span six (6) cells in each of columns B1, A1 and D0. Alternatively, although less preferred, the read and write word lines can be patterned as straight vertical lines and the pairs of differential input/output lines can be made to trace a zig-zag pattern (which means the input/output lines may have considerable additional capacitance relative to the preferred case). In this less preferred case, each of the columns of tri-port cells may be patterned as linear columns.

As described more fully hereinbelow with respect to FIG. 6, complementary data (e.g., DATA, DATAB) stored at latched internal nodes of a selected tri-port memory cell may be provided to a respective pair of input/output lines by providing a respective transfer signal to the selected cell. The transfer signals include six (6) transfer signals for each of the four (4) registers of tri-port cells in the tri-port memory array 20, for a total of twenty four (24) transfer signals. In FIG. 4, half of these twenty four (24) transfer signals are shown and illustrated as XFERA0, XFERA1 and XFERA2, XFERB0, XFERB1 and XFERB2, XFERC0, XFERC1 and XFERC2 and XFERD0, XFERD1 and XFERD2. Each of these illustrated transfer signals is electrically coupled to a corresponding group of three (3) staggered cells within all columns of the same register. For example, transfer signal XFERA0 can be applied as a logic 1 signal to cells 0–2 of all A columns (A0–A127) during a first portion of a write-to-memory time interval. Referring specifically to column A0, complementary data within cells 0–2 can be simultaneously transferred to the first three pairs of input/output lines (IO0, IOB0), (IO1, IOB1 ) and (IO2 and IOB2), respectively. At the same time, the first three (3) bits of column A1 are being transferred to input/output lines (IO4, IOB4), (IO5, IOB5) and (IO6, IOB6). Similarly, the first three (3) bits of all 128 columns of register A are transferred together. Note, that IO3 and IOB3 are not used during this transfer operation as they do not serve the A register. Thus, 384 bits of data (3 bits×128 columns) from cells 0–2 of register A can be simultaneously transferred to 384 of the 514 ports in the bidirectional input/output port 21 illustrated by FIGS. 1–3. This transfer of complementary data can then be sensed and amplified by the array 22 of sense amplifiers using techniques well known to those skilled in the art. Similarly, transfer signal XFERA1 can be applied as a logic 1 signal to cells 3–5 of column A0 (and all other A columns) during a second portion of a write-to-memory time interval so that complementary data within cells 5, 4 and 3 can be simultaneously transferred to input/output lines (IO0, IOB0), (IO1, IOB1) and (IO2 and IOB2), respectively.

Following in the same manner, transfer signal XFERA2 can be applied as a logic 1 signal to cells 6–8 of column A0 (and all other A columns) during a third portion of a write-to-memory time interval. Referring specifically to column A0, data within cells 6, 7 and 8 can be simultaneously transferred to input/output lines (IO0, IOB0), (IO1, IOB1) and (IO2 and IOB2), respectively. Similarly, transfer signal XFERA3 (not shown) can be applied as a logic 1 signal to cells 11–9 of column A0 (and all other A columns) during a fourth portion of a write-to-memory time interval so that complementary data within cells 11, 10 and 9 can be simultaneously transferred to input/output lines (IO0, IOB0), (IO1, IOB1) and (IO2 and IOB2), respectively. Transfer signal XFERA4 (not shown) can also be applied as a logic 1 signal to cells 12–14 of column A0 (and all other A columns) during a fifth portion of a write-to-memory time interval so that complementary data within cells 12, 13 and 14 can be simultaneously transferred to input/output lines (IO0, IOB0), (IO1, IOB1) and (IO2 and IOB2), respectively. Finally, transfer signal XFERA5 (not shown) can be applied as a logic 1 signal to cells 17–15 of column A0 (and all other A columns) during a sixth portion of a write-to-memory time interval so that complementary data within cells 17, 16 and 15 can be simultaneously transferred to input/output lines (IO0, IOB0), (IO1, IOB1) and (IO2 and IOB2), respectively.

By a similar method of operation with respect to register B, transfer signal XFERB0 can be applied as a logic 1 signal to cells 0–2 of column B0 (and all other B columns in register B) during a first portion of a write-to-memory time interval so that complementary data within each cell can be simultaneously transferred to the second, third and fourth pairs of input/outputs lines (IO1, IOB1), (IO2, IOB2) and (IO3 and IOB3), respectively. As described more fully hereinbelow with respect to FIGS. 5A–5D, the above described operations can be repeated to load the entire contents of register A, register B, register C or register D one-at-a-time into a row(s) of memory cells in the supplemental memory array 30, during respective write-to-memory time intervals which may have a duration of less than about 200 ns. Using similar operations, the entire contents of a row of memory cells in the supplemental memory array 30 (e.g., 2304 bits) may be loaded into a selected register (A, B, C or D) during six (6) consecutive portions of a read-from-memory time interval (i.e., "fetch" interval).

These write-to-memory and read-from-memory operations may be more fully understood by reference to TABLES 1–4 below. In particular, TABLE 1 illustrates a possible sequence of parallel data transfers from the tri-port register A illustrated by FIG. 2 to a single row (or possibly a plurality of rows) of memory cells in the supplemental memory array 30, during a write-to-memory time interval which may contain six nonoverlapping transfer intervals therein. TABLES 2–4 similarly illustrate the sequence of parallel data transfers from registers B, C and D, respectively, to the supplemental memory array 30. Note, that for a 36 bit wide external configuration, external bits 18–35 come from bits 0–17 of words 64 through 127.

TABLE 1

| TRANSFER SIGNAL | WORD0 | WORD1 | ... | WORD63 | WORD64 | ... | WORD127 |
|---|---|---|---|---|---|---|---|
| XFERA0: | A0 (0–2) | A1 (0–2) | ... | A63 (0–2) | A64 (0–2) | ... | A127 (0–2) |
| XFERA1: | A0 (3–5) | A1 (3–5) | ... | A63 (3–5) | A64 (3–5) | ... | A127 (3–5) |
| XFERA2: | A0 (6–8) | A1 (6–8) | ... | A63 (6–8) | A64 (6–8) | ... | A127 (6–8) |
| XFERA3: | A0 (9–11) | A1 (9–11) | ... | A63 (9–11) | A64 (9–11) | ... | A127 (9–11) |
| XFERA4: | A0 (12–14) | A1 (12–14) | ... | A63 (12–14) | A64 (12–14) | ... | A127 (12–14) |
| XFERA5: | A0 (15–17) | A1 (15–17) | ... | A63 (15–17) | A64 (15–17) | ... | A127 (15–17) |

TABLE 2

| TRANSFER SIGNAL | WORD0 | WORD1 | ... | WORD63 | WORD64 | ... | WORD127 |
|---|---|---|---|---|---|---|---|
| XFERB0: | B0 (0–2) | B1 (0–2) | ... | B63 (0–2) | B64 (0–2) | ... | B127 (0–2) |
| XFERB1: | B0 (3–5) | B1 (3–5) | ... | B63 (3–5) | B64 (3–5) | ... | B127 (3–5) |
| XFERB2: | B0 (6–8) | B1 (6–8) | ... | B63 (6–8) | B64 (6–8) | ... | B127 (6–8) |
| XFERB3: | B0 (9–11) | B1 (9–11) | ... | B63 (9–11) | B64 (9–11) | ... | B127 (9–11) |
| XFERB4: | B0 (12–14) | B1 (12–14) | ... | B63 (12–14) | B64 (12–14) | ... | B127 (12–14) |
| XFERB5: | B0 (15–17) | B1 (15–17) | ... | B63 (15–17) | B64 (15–17) | ... | B127 (15–17) |

TABLE 3

| TRANSFER SIGNAL | WORD0 | WORD1 | ... | WORD63 | WORD64 | ... | WORD127 |
|---|---|---|---|---|---|---|---|
| XFERC0: | C0 (0–2) | C1 (0–2) | ... | C63 (0–2) | C64 (0–2) | ... | C127 (0–2) |
| XFERC1: | C0 (3–5) | C1 (3–5) | ... | C63 (3–5) | C64 (3–5) | ... | C127 (3–5) |
| XFERC2: | C0 (6–8) | C1 (6–8) | ... | C63 (6–8) | C64 (6–8) | ... | C127 (6–8) |

TABLE 3-continued

| TRANSFER SIGNAL | WORD0 | WORD1 | ... | WORD63 | WORD64 | ... | WORD127 |
|---|---|---|---|---|---|---|---|
| XFERC3: | C0 (9–11) | C1 (9–11) | ... | C63 (9–11) | C64 (9–11) | ... | C127 (9–11) |
| XFERC4: | C0 (12–14) | C1 (12–14) | ... | C63 (12–14) | C64 (12–14) | ... | C127 (12–14) |
| XFERC5: | C0 (15–17) | C1 (15–17) | ... | C63 (15–17) | C64 (15–17) | ... | C127 (15–17) |

TABLE 4

| TRANSFER SIGNAL | WORD0 | WORD1 | ... | WORD63 | WORD64 | ... | WORD127 |
|---|---|---|---|---|---|---|---|
| XFERD0: | D0 (0–2) | D1 (0–2) | ... | D63 (0–2) | D64 (0–2) | ... | D127 (0–2) |
| XFERD1: | D0 (3–5) | D1 (3–5) | ... | D63 (3–5) | D64 (3–5) | ... | D127 (3–5) |
| XFERD2: | D0 (6–8) | D1 (6–8) | ... | D63 (6–8) | D64 (6–8) | ... | D127 (6–8) |
| XFERD3: | D0 (9–11) | D1 (9–11) | ... | D63 (9–11) | D64 (9–11) | ... | D127 (9–11) |
| XFERD4: | D0 (12–14) | D1 (12–14) | ... | D63 (12–14) | D64 (12–14) | ... | D127 (12–14) |
| XFERD5: | D0 (15–17) | D1 (15–17) | ... | D63 (15–17) | D64 (15–17) | ... | D127 (15–17) |

Referring still to FIG. 4, two groups of four (4) horizontal data lines are also provided for each row (e.g., 18 rows) of tri-port cells in the tri-port memory array 20. As will be understood by those skilled in the art, these data lines are preferably electrically coupled to the left or right side I/O circuits 16 of FIG. 1. As illustrated, left side data lines for each row of cells include two (2) complementary read data lines RB and RBB and two (2) complementary write data lines WB and WBB. These left side data lines are electrically coupled to the 64 left side columns (0–63) of each of registers A, B, C and D. Right side data lines (not shown) are also electrically coupled to the 64 right side columns (64–127) of each of registers A, B, C and D. Here, the use of separate right side and left side data lines enables the simultaneous loading of 36 bits of data as a first group of 18 bits and a second group of 18 bits, into respective left side and right side columns having 18 tri-port cells therein. The ability to read data from and write data into individual tri-port cells will be described more fully hereinbelow with respect to FIG. 6.

Figure 5A:
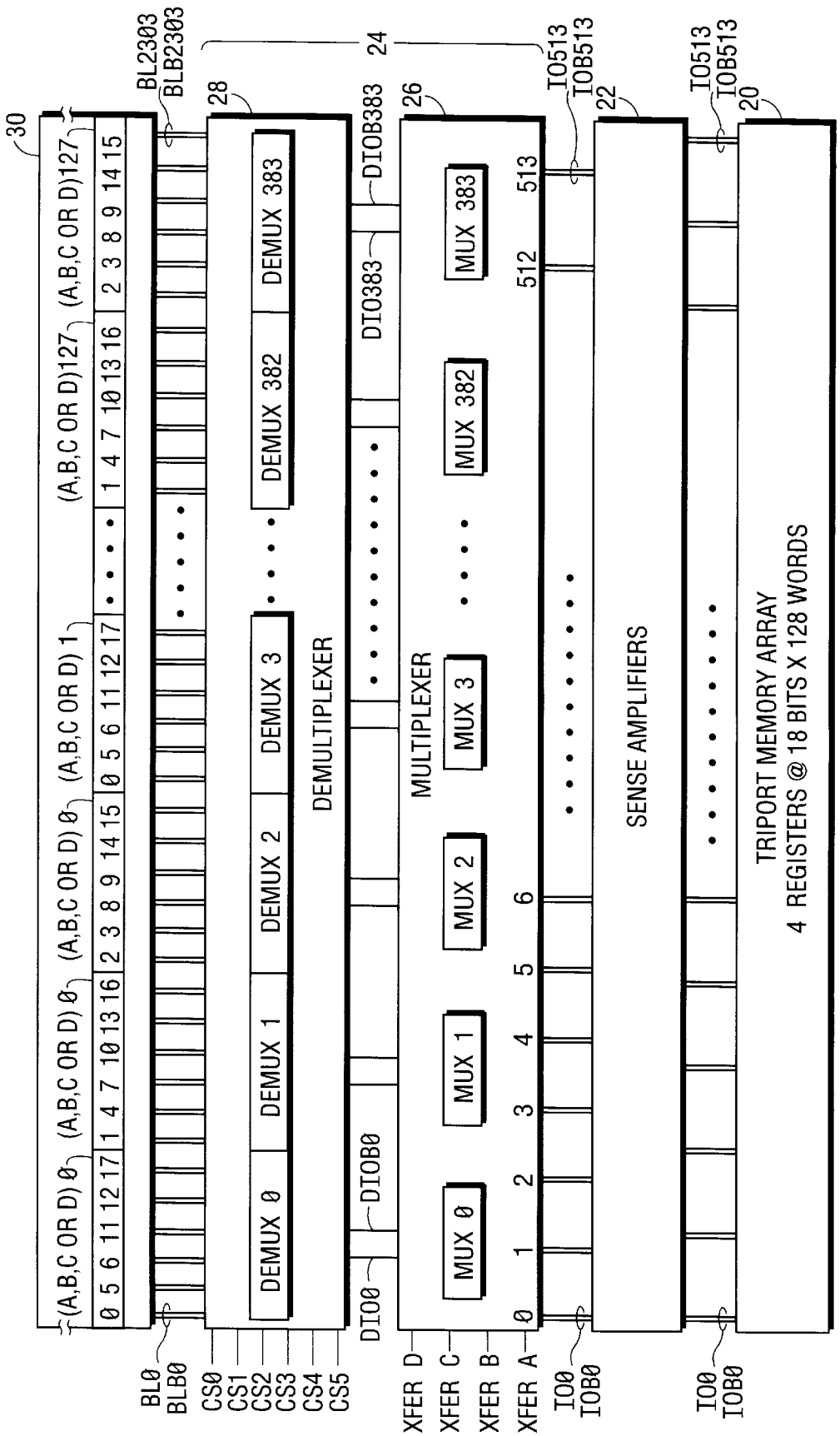
FIG. 5A is a schematic of the preferred steering circuitry of FIG. 1.

Referring now to FIG. 5A, a top-level electrical schematic of the preferred steering circuitry of FIG. 1 is provided. As will become evident from the following description, the steering circuitry 24 enables the highly efficient parallel/serial transfer of multiple bits of data from each column of tri-port cells in a register thereof to a row(s) of memory cells in the supplemental memory array 30 during a respective portion of a write-to-memory time interval and vice versa during a respective portion of a read-from-memory time interval. Using this steering circuitry 24, it is possible to obtain parallel/serial transfer of data from all 18 cells within each of the 128 columns in a register in the tri-port memory array 20 to the supplemental memory array 30 and vice versa in only six sequential steps with reduced layout wiring penalty. This advantage may be achieved even if the columns of tri-port cells in the registers are aligned in a generally orthogonal direction relative to a row of memory cells in the supplemental memory array 30.

Figure 5B:
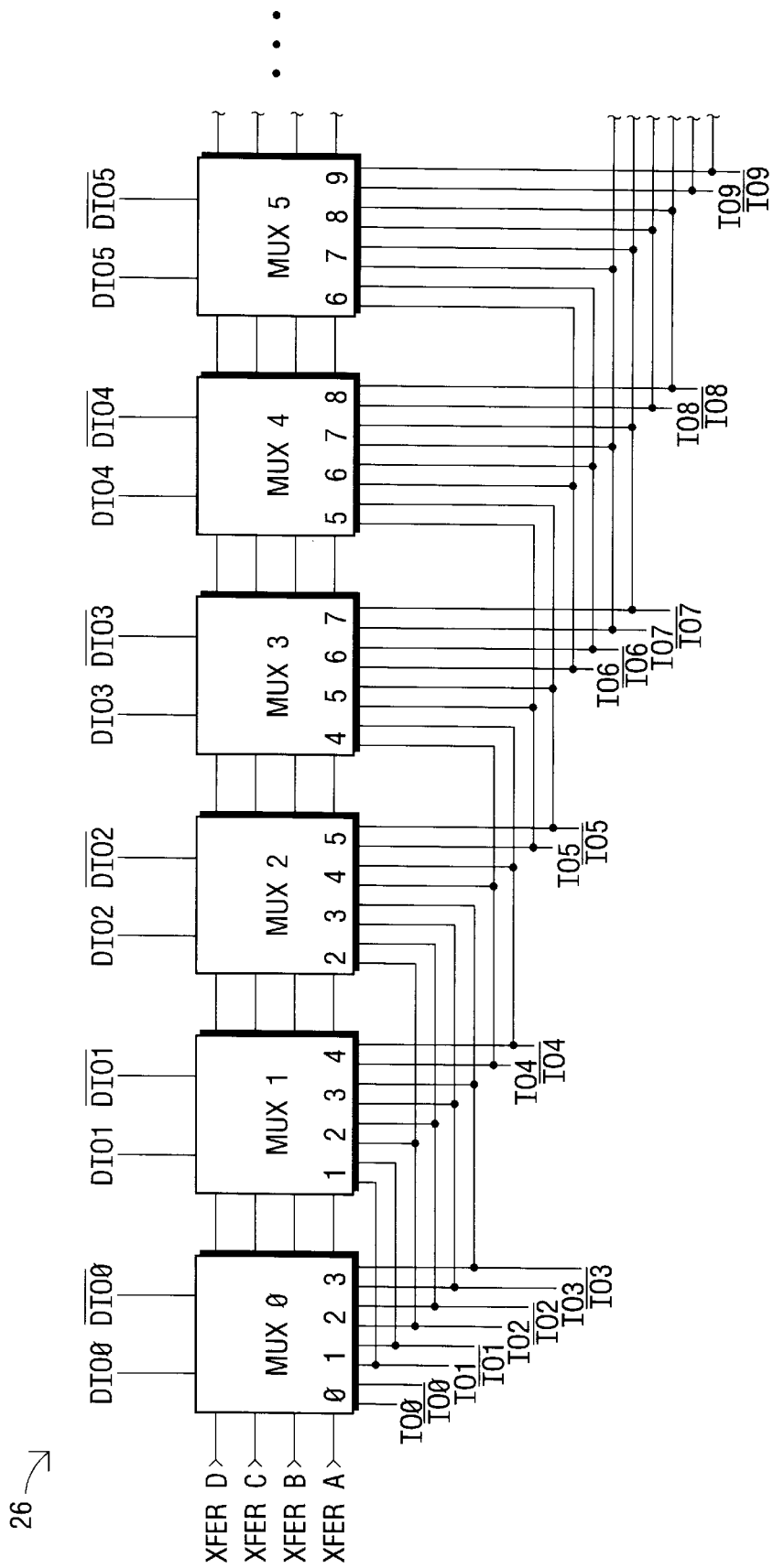
FIG. 5B is a block electrical schematic of a portion of the multiplexer circuit of FIG. 5A.
Figure 5C:
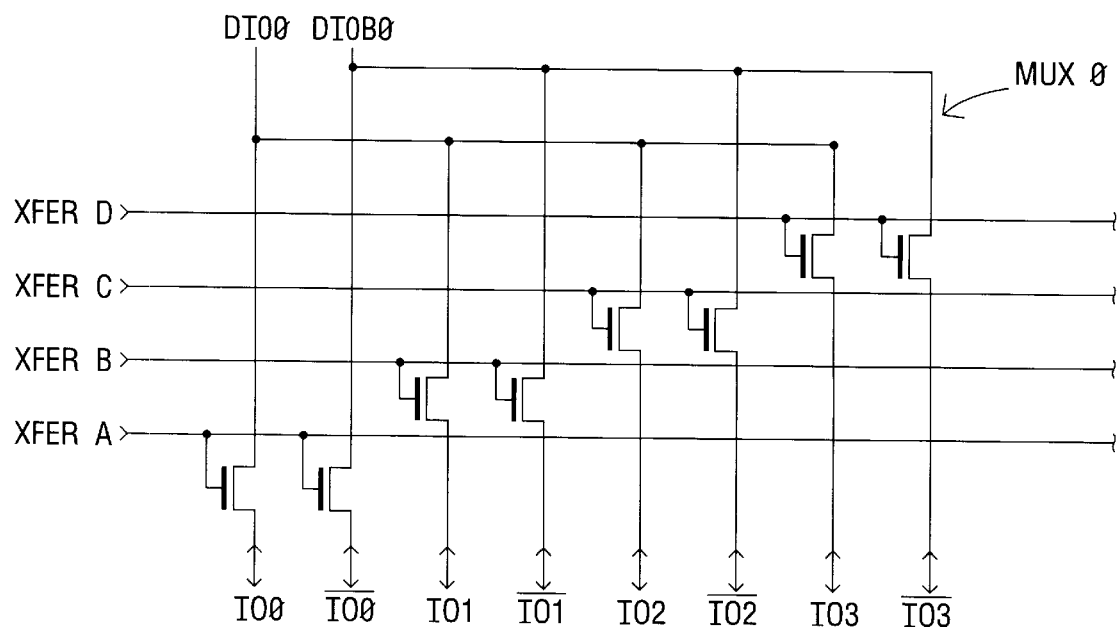
FIG. 5C is an electrical schematic of a multiplexer of FIG. 5B.
Figure 5D:
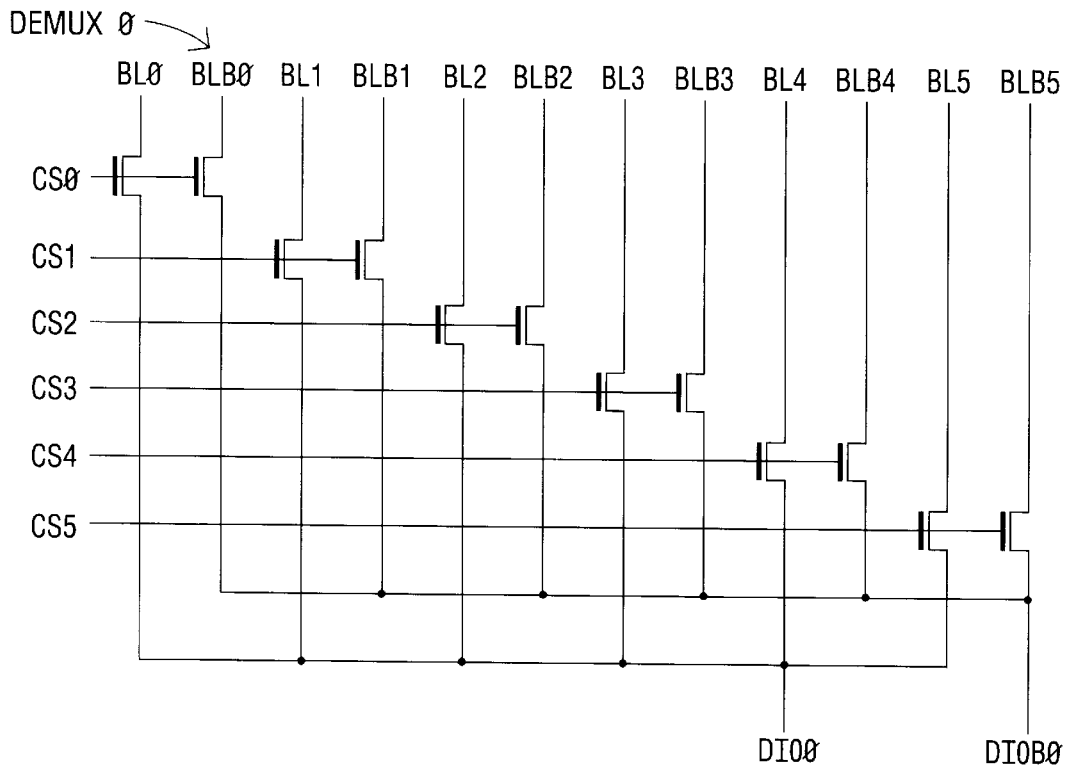
FIG. 5D is an electrical schematic of a demultiplexer of FIG. 5A.

In particular, the steering circuitry 24 of FIG. 5A includes an array 26 of 4-input multiplexers (MUX0–MUX383) which are responsive to a plurality of register transfer signals XFERA, XFERB, XFERC and XFERD. A portion of this array 26 is also illustrated by FIG. 5B. Referring now to FIGS. 5B–5C, each MUX comprises four (4) pairs of pass transistors which electrically couple one of four pairs of input/output lines (e.g., (IO0, IOB0), (IO1, IOB1), (IO2, IOB2) and (IO3, IOB3)) to a single pair of data input/output lines (DIO0, DIOB0). The gate electrodes of each pair of pass transistors are also responsive to application of a respective register transfer signal thereto. Thus, the register transfer signals XFERA–XFERD can be used to selectively couple each pair of input/output lines to the data input/output lines (DIO0, DIOB0). With respect to the first column A0 of register A, if XFERA is asserted, input/output line pairs (IO0, IOB0), (IO1, IOB1) and (IO2, IOB2) are routed to the first three data input/output line pairs (DIO0, DIOB0), (DIO1, DIOB1) and (DIO2, DIOB2). Similarly, with respect to the first column B0 of register B, if XFERB is asserted, input/output line pairs (IO1, IOB1), (IO2, IOB2) and (IO3, IOB3) are routed to the first three data input/output line pairs. With respect to the first column C0 of register C, if XFERC is asserted, input/output line pairs (IO2, IOB2), (IO3, IOB3) and (IO4, IOB4) are routed to the first three data input/output line pairs. Finally, with respect to the first column D0 of register D, if XFERD is asserted, input/output line pairs (IO3, IOB3), (IO4, IOB4) and (IO5, IOB5) are routed to the first three data input/output line pairs. Note, again, that as described with respect to FIG. 5B, data input/output lines DIO0 and DIOB0 transfer data from tri-port cells A0–0, A0–5, A0–6, A0–11, A0–12 and A0–17 upon selection of one of the six transfer signals XFERA0–XFERA5, respectively.

The steering circuitry 24 also includes a plurality of demultiplexers (DEMUX0–DEMUX383) 28 (at the supplemental memory array 30) for routing each of the plurality of data input/output lines {(DIO0, DIOB0), . . . , (DIO383, DIOB383)} to one of a plurality (e.g., 6) of pairs of adjacent bit lines {(BL0, BLB0), . . . , (BL2303, BLB2303)} in a selected block of the supplemental memory 30. As illustrated best by FIG. 5D, each of these demultiplexers is responsive to six (6) column select signals (CS0–CS5). During a first portion of a write-to-memory time interval, signals XFERA0, XFERA and CS0 can be simultaneously set to logic 1 values to enable the parallel transfer of data from cells 0–2 in columns A0–A127 of register A to a row of memory cells in the supplemental memory array 30. In particular, these 384 bits of data can be simultaneously loaded as respective bits into every sixth consecutive memory cell within the row (e.g., cells 0, 6, 12, 18, . . . ). Next, during a second portion of a write-to-memory time interval, signals XFERA1, XFERA and CS1 can be simultaneously set to logic 1 values to enable the parallel transfer of data from cells 3–5 in columns A0–127 to other memory cells (e.g., cells 1, 7, 13 19, . . . ) of the same row (or a different row) of memory cells in the supplemental memory array 30, as illustrated. Accordingly, in six (6) consecutive steps, data from each nonlinear column of tri-port cells in any register can be loaded into a block of adjacent memory cells in the same row in the supplemental memory array 30.

More specifically, the array 26 of 4-input multiplexers (MUX0–MUX383) and array 28 of demultiplexers (DEMUX0–DEMUX383) are arranged so that MUX0–MUX2 and DEMUX0–DEMUX2 control the routing of data between columns A0, B0, C0 or D0 of the tri-port memory array 20 and the first 18 pairs of bit lines BL and BLB (i.e., BL0, BLB0 to BL17 and BLB17). Similarly, multiplexers MUX3–MUX5 and demultiplexers DEMUX3–DEMUX5 control the routing of data between columns A1, B1, C1 or D1 of the tri-port memory array 20 and the second 18 pairs of bit lines BL and BLB and multiplexers MUX6–MUX8 and demultiplexers DEMUX6–DEMUX8 control the routing of data between columns A2, B2, C2 or D2 of the tri-port memory array 20 and the third 18 pairs of bit lines BL and BLB. Here, each of the input/output lines IO and IOB illustrated by FIG. 5B are electrically coupled to three multiplexers (except for those at each end).

As illustrated best by FIGS. 2, 5A and 5B, during a transfer of data from (to) register A in the tri-port memory array 20 to (from) the supplemental memory array 30, the physical location of the data transferred to (from) memory cells in a row of memory in the supplemental memory array 30 is independent of the source (destination) of data (register A, B, C, or D). The sequence of each word of 18 bits stored in a row of the supplemental memory is: (|0,5,6,11,12,17|, |, 4,7,10,13,16| and |2,3,8,9,14,15|). If XFERA0 and XFERA are set to logic 1 potentials and column select signal CS0 is also set high, the data in cell 0 of column A0 (provided to port 0 of the bidirectional port 21) can be passed through MUX0 and DEMUX0 to bit lines BL0 and BLB0. Similarly and simultaneously, the data in cell 1 of column A0 can be passed through MUX1 and DEMUX1 to bit lines BL6 and BLB6 and the data in cell 2 of column A0 can be passed through MUX2 and DEMUX2 to bit lines BL12 and BLB12. Likewise, if instead XFERA1 and XFERA are set to logic 1 potentials and column select signal CS1 is also set high, the data in cell 5 of column A0 (provided to port 0 of the bidirectional port 21) can be passed through MUX0 and DEMUX0 to bit lines BL1 and BLB1, the data in cell 4 of column A0 can be passed through MUX1 and DEMUX1 to bit lines BL7 and BLB7 and the data in cell 3 of column A0 can be passed through MUX2 and DEMUX2 to bit lines BL13 and BLB13.

With respect to column A1 of register A, if XFERA0 and XFERA are set to logic 1 potentials and column select signal CS0 is also set high, the data in cell 0 of column A1 (provided to port 4 of the bidirectional port 21) can be passed through MUX3 and DEMUX3 to bit lines BL18 and BLB18, the data in cell 1 of column A1 (provided to port 5 of the bidirectional port 21) can be passed through MUX4 and DEMUX4 to bit lines BL24 and BLB 24 and the data in cell 2 of column A1 (provided to port 6 of the bidirectional port 21) can be passed through MUX5 and DEMUX5 to bit lines BL30 and BLB30. Continuing with respect to column A1 of register A, if XFERA1 and XFERA are set to logic 1 potentials and column select signal CS1 is also set high, the data in cell 5 of column A1 (provided to port 4 of the bidirectional port 21) can be passed through MUX3 and DEMUX3 to bit lines BL19 and BLB19, the data in cell 4 of column A1 (provided to port 5 of the bidirectional port 21) can be passed through MUX4 and DEMUX4 to bit lines BL25 and BLB25 and the data in cell 3 of column A1 (provided to port 6 of the bidirectional port 21) can be passed through MUX5 and DEMUX5 to bit lines BL31 and BLB31. Accordingly, on a column-by-column basis, the steering circuitry 24 provides a routing a selected three of four (4) ports to three (3) pairs of data input/output lines to eighteen (18) bit line pairs, this being repeated 128 times.

Referring now to FIG. 6, a preferred tri-port SRAM cell contains a unidirectional write port formed by complementary data input lines (WB and WBB—horizontal wires in FIGS. 1–4, 5A) and enabled by a write word line (WWL—zig zag vertical wire in FIGS. 2, 4) and a unidirectional read port formed by complementary data output lines (RB and RBB—horizontal wires in FIGS. 1–4, 5A) and enabled by a read word line (RWL—zig zag vertical wire in FIGS. 2, 4). A bidirectional input/output port is also provided by complementary lines IO and IOB (vertical wires in FIGS. 1–4, 5A) and enabled by a transfer signal (XFER). The 24 XFER signal lines each run more or less horizontally. In FIGS. 1–4 and 5A, each of the transfer signal lines electrically connects three cells in every column of a respective register. Write data can be transferred from the complementary data input lines (one at Vss and one at Vdd) to the tri-port SRAM cell by applying a logic 1 potential to the write word line WWL which is electrically coupled to the gate electrodes of two write pass transistors T1 and T2. Cell data can also be read independently and simultaneously on complementary data lines by applying a logic 1 potential to the read word line RWL which is electrically coupled to the gate electrodes of two read pass transistors T3 and T4. The reading operation can be performed without affecting cell voltage levels by eliminating a direct electrical connection between lines RB and RBB and internal nodes DATAB and DATA, respectively. In particular, the values of the voltages at internal nodes DATAB and DATA can be determined by sensing the "on" or "off" condition of pull down transistors PD1 and PD2 once a logic 1 potential is applied to the read word line RWL. In this manner, the read and write ports perform as the separate read and write ports of a conventional dual-port SRAM cell. The internally stored data can also be provided out to the bidirectional input/output port (lines IO and IOB) by driving the transfer signal (XFER) to a logic 1 potential to turn on pass transistors T5 and T6. Here, lines IO and IOB are initially equilibrated to a high voltage, preferably Vdd. Then, either line IOB or line IO is brought to a somewhat lower potential through T5 or T6 depending on whether DATAB or DATA is at a logic 0 potential. The difference in potential between line IO and IOB is then sensed by a sense amplifier, such as the sense amplifier 22 in FIG. 1. To write data from the supplemental memory array 30 into a tri-port SRAM cell, lines IO and IOB at the bidirectional input/output port are set to complementary logic values (Vdd and Vss) and then the transfer signal XFER is set to a logic 1 potential to turn on pass transistors T5 and T6. In this manner, the bidirectional input/output port performs the same functions as a combined read port and write port of a conventional SRAM cell.

In addition to the above-described detailed and comprehensive description of the present invention, a general overview of the operations of a preferred first-in first-out (FIFO) buffer memory device will now be provided. In particular, operation of the preferred FIFO begins with a master reset operation. This operation performs a number of functions, including initialization of the write register pointers 19*a*, 19*b* to a current write register and next-to-write register in the tri-port memory array 20. The current write register may be arbitrarily selected as register A, for example, and the next-to-write register may arbitrarily be selected as register B. The write column counter 11 may be initialized to a specific count (e.g., count 0). The read register pointers 17a, 17b will also be initialized to point to the same registers as the write register pointers 19a, 19b, and the read column counter 13 will be initialized to the specific count (e.g., count 0). Thus, reading and writing operations may commence from the same starting location in the same register.

Based on the preferred construction of the tri-port memory array 20, data initially written into column 0 of register A is immediately available for reading since the write and read column counters (and register pointers) address the same location. This provides the very fast fall-through speed of the preferred FIFO. Columns 1–63 of register A can also be written to during consecutive write clock cycles as the write column counter 11 is incremented. This data, like the data initially written into column 0, is also immediately available for reading as the read column counter 13 is incremented with each consecutive read clock cycle. If the preferred FIFO is configured as a 36-bit part, columns 0 and 127 of register A may be simultaneously selected for writing by the write column counter 11. Here, the 18-bit LSB and 18-bit MSB portions of each 36-bit word may be simultaneously written into designated columns on side A and side B of the tri-port memory array 20. During the next write clock cycles, columns 1 and 126 of register A may be simultaneously written to, and then columns 2 and 125 may be simultaneously written to, and so on until the two central most columns have been written. Alternatively, columns 0 and 64 of a selected register may be written to during a first write clock cycle, and then columns 1 and 65 may be written to during a second write clock cycle. This sequence may continue until central column 63 and right side column 127 have been filled. This latter sequence may be preferred in order to simply the design of the column decoder logic.

If, for purposes of illustration, many write cycles occur before any read cycles, register A may become full. In particular, after 64 write cycles, register A will be filled and then subsequent writing will be directed to register B. Once register B has been filled, writing will commence in register C, for example, and then in register D. Again, as stated above, the selection of registers C and D is not predetermined, but is based on the sequence of arbitration operations performed by the processor and control logic 15 and the particular order of write and read cycles. Once register D has been filled, spaced in the tri-port memory array 20 must be made available for additional write data since, in the preferred embodiment, there is no fifth register.

The data in register A cannot be disturbed because it contains the next data to be read upon selection by the read column counter 13 and this read data must be immediately available. Similarly, the data in register B cannot be disturbed because a number of read cycles, perhaps 63 read cycles, may have occurred since master reset and therefore, the contents of register B may soon be required. However, if the current read register pointer 17a still points to register A, the contents of register C will not be required for reading for at least 640 nanoseconds (64 read cycles at 10 ns/cycle) as register B is read. Therefore, shortly after register C has been filled and assuming the current read register pointer 17a is still pointing to register A (i.e., the current read register pointer 17a is still at least one register removed from the data in register C), the contents of register C can be transferred to a row of memory cells in the supplemental memory array 30 (for later recall once the current read register pointer 17a is updated to point to register B). This transfer operation (which typically takes 200 ns) must be completed in 640 ns to make room for additional write data to follow the current write data in register D. Moreover, as additional data is written to the tri-port memory array 20 (still without any significant reading), the write data will alternately fill register C, then D, then C, then D and so on. After each of these registers has been filled, its contents are transferred to a sequence of rows of the supplemental memory 30 defined by the write row pointer 23. For example only, the first data written into register C may be transferred to row 0 of the supplemental memory 30 and the first data written into register D may be transferred to row 1. The next write data to fill register C in the sequence is then transferred to row 2 and the next write data to fill register D is transferred to row 3, and so on.

According to a preferred aspect of the present invention, the transfer of data from a register in the tri-port memory array to a row of memory cells (preferably a single row) in the supplemental memory array 30 (using six (6) consecutive transfer operations) takes less than about 200 nanoseconds, as does a transfer from the supplemental memory array 30 to a register in the tri-port memory array 20. Thus, during the 640 nanoseconds (at maximum operating frequency) required to fill or empty a register during write or read operations, there is sufficient time to do at least three supplemental memory operations requiring 200 ns each, for example. Thus, during 640 ns (the duration of the minimum "write-to-register" time interval or the duration of the minimum "read-from-register" time interval), there is sufficient time to perform one write-to-memory transfer operation, one read-from-memory transfer operation and, if necessary, one refresh operation in the event the supplemental memory array 30 is comprised of DRAM memory cells. Accordingly, the contents of a register just written to can be transferred to the supplemental memory array 30 and the contents of the next register to be read can be transferred back into the same or another register in the tri-port memory array 20 to allow continuous writing and reading. This makes the register whose data was just transferred seamlessly available as the next read data. Thus, with four (4) registers, there can be, if necessary, a register currently being read, a register with the next data to be read (this data available before all data in the current read register has been read), a register currently being written to (this register may be the same as the current read register if the FIFO is almost empty) and a register that has been filled with write data and whose data is being transferred to the supplemental memory array 30.

The preceding discussion gives some additional insights into the present invention which utilizes four (4) tri-port registers and a supplemental memory to achieve the fall-through characteristics of a dual-port based FIFO with the total capacity of a large DRAM. It further gives a possible sequence of choosing registers during a single, very specific order of writing (perhaps thousands of words) before doing any reading. But, correct operation is required for any sequence of writing and reading, as long as the capacity of supplemental memory is not exceeded. Here, the processor and control logic 15 chooses which register is selected to read next and which register is selected to write next under all possible write/read circumstances. These and other aspects of the processor and control logic 15 are more fully described in the aforementioned copending and commonly assigned U.S. Application entitled "Methods of Controlling Memory Buffers Having Tri-Port Cache Arrays Therein".

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:

an array of memory cells arranged as a plurality of rows of multi-port memory cells and a plurality of nonlinear columns of multi-port memory cells; and a plurality of input/output lines electrically coupled to said array, each of said plurality of input/output lines electrically coupled to at least two multi-port memory cells in each of at least two nonlinear columns thereof.

2. The memory device of claim 1, wherein the multi-port memory cells comprise tri-port memory cells; and wherein each of the nonlinear columns of multi-port memory cells is electrically coupled to a respective pair of read and write word lines.

3. The memory device of claim 2, wherein the tri-port memory cells comprise tri-port SRAM cells; and wherein each pair of read and write word lines is serpentine-shaped.

4. The memory device of claim 3, wherein the nonlinear columns of multi-port memory cells comprise serpentine-shaped columns of memory cells.

5. The memory device of claim 2, wherein each of the nonlinear columns of multi-port memory cells is electrically coupled to a plurality of transfer enable lines.

6. The memory device of claim 5, wherein each of the transfer enable lines in a respective plurality thereof is electrically coupled to at least two multi-port memory cells in each of at least two nonlinear columns of multi-port memory cells.

7. The memory device of claim 2, wherein said array of memory cells comprises first and second registers of tri-port memory cells; wherein the first and second registers of tri-port memory cells each comprise a plurality of nonadjacent nonlinear columns of tri-port memory cells; and wherein the at least two nonlinear columns are in different registers.

8. The memory device of claim 7, further comprising a plurality of first transfer enable lines electrically coupled to each of the nonlinear columns of tri-port memory cells in the first register and a plurality of second transfer enable lines electrically coupled to each of the nonlinear columns of tri-port memory cells in the second register.

9. The memory device of claim 8, wherein each of the first transfer enable lines is electrically coupled to at least two tri-port memory cells in each of the nonlinear columns of tri-port memory cells in the first register.

10. The memory device of claim 9, wherein each of the nonlinear columns of tri-port memory cells is electrically coupled to a respective pair of serpentine-shaped read and write lines; and wherein each of the rows of multi-port memory cells spans at least one of the nonlinear columns of tri-port memory cells in each of the first and second registers.

11. The memory device of claim 1, wherein said array of memory cells comprises a tri-port memory array having a read port, a write port and bidirectional input/output port and a first register of tri-port memory cells; wherein the first register comprises a plurality of nonlinear columns of tri-port memory cells; and wherein the plurality of input/output lines are electrically coupled to said bidirectional input/output port.

12. The memory device of claim 11, further comprising:

a supplemental memory array having a plurality of bit lines; and a bidirectional crosspoint switch having first switch lines electrically coupled to the bidirectional input/output port and second switch lines electrically coupled to the plurality of bit lines.

13. The memory device of claim 12, wherein said crosspoint switch comprises means for electrically coupling each of said plurality of input/output lines in parallel to respective bit lines in said supplemental memory array.

14. The memory device of claim 1, wherein said plurality of input/output lines includes a pair of complementary input/output lines that is electrically coupled to six multi-port memory cells in each of three nonlinear columns of multi-port memory cells.

15. The memory device of claim 14, wherein said array of memory cells comprises a tri-port memory array having a read port, a write port and a bidirectional input/output port and first and second registers of tri-port memory cells; wherein the first and second registers of tri-port memory cells each comprises a plurality of serpentine-shaped columns of tri-port memory cells; and wherein each of the rows of multi-port memory cells spans at least two of the nonlinear columns of tri-port memory cells in each of the first and second registers.

16. The memory device of claim 15, further comprising a plurality of pairs of complementary read data lines and a plurality of pairs of complementary write data lines; and wherein each pair of read data lines and each pair of write data lines is electrically coupled to a respective row of multi-port memory cells.

17. The memory device of claim 16, wherein the plurality of input/output lines extend in an orthogonal direction relative to the plurality of pairs of complementary read data lines and the plurality of pairs of complementary write data lines.

18. An integrated circuit memory device, comprising:

an array of tri-port memory cells arranged as first and second registers of tri-port memory cells which each contain a plurality of spaced nonlinear columns of tri-port memory cells; and a plurality of input/output lines, said plurality of input/output lines containing a first pair of complementary input/output lines electrically coupled to first and second tri-port memory cells in each of the first and second registers thereof.

19. The memory device of claim 18, wherein the first register of tri-port memory cells contains a plurality of serpentine-shaped columns of tri-port memory cells.

20. The memory device of claim 19, wherein each of the serpentine-shaped columns of tri-port memory cells in the first register thereof is electrically coupled to a respective pair of serpentine-shaped read and write word lines.

21. The memory device of claim 20, further comprising:

a supplemental memory array having a plurality of pairs of complementary bit lines; and a bidirectional crosspoint switch having first switch lines electrically coupled to the plurality of pairs of complementary bit lines and second switch lines electrically coupled to said plurality of input/output lines.

22. The memory device of claim 21, wherein said plurality of input/output lines contain a second pair of complementary input/output lines electrically coupled to third and fourth memory cells in each of the first and second registers thereof; and wherein said bidirectional crosspoint switch comprises means for electrically coupling the first and second pair of complementary input/output lines in parallel to first and second pairs of complementary bit lines in said supplemental memory array.

23. An integrated circuit memory device, comprising:
a first register having a plurality of nonlinear columns of tri-port memory cells therein;
a plurality of pairs of input/output lines electrically coupled to each of the nonlinear columns of tri-port memory cells in said first register;
a supplemental memory array containing a plurality of pairs of bit lines; and
means, responsive to a register transfer signal, for electrically coupling said plurality of pairs of input/output lines in parallel to the plurality of pairs of bit lines.

24. The memory device of claim 23, wherein the plurality of nonlinear columns of tri-port memory cells extend in a first direction; and wherein said supplemental memory array is arranged as a plurality of columns of memory cells which are each electrically coupled to a respective pair of bit lines in the plurality thereof, and a plurality of rows of memory cells which extend in a second direction that is substantially orthogonal to the first direction.

25. The memory device of claim 24, wherein said electrically coupling means comprises means, responsive to X cell select signals, for electrically coupling each of X pairs of bit lines one-at-at-time to a pair of input/output lines.

26. The memory device of claim 25, wherein each of the plurality of nonlinear columns of tri-port memory cells contains Y tri-port memory cells; and wherein Y/X pairs of input/output lines are electrically coupled to each of the plurality of nonlinear columns of tri-port memory cells in said first register.

27. The memory device of claim 26, wherein each of the plurality of nonlinear columns of tri-port memory cells is serpentine-shaped.

28. The memory device of claim 27, further comprising a plurality of pairs of serpentine-shaped read and write lines, each pair of read and write lines electrically coupled to each of the Y cells in a respective column of tri-port memory cells.

29. The memory device of claim 28, wherein said first register contains Z nonlinear columns of tri-port memory cells; and wherein each row of memory cells in said supplemental memory array contains at least Y×Z cells therein.

* * * * *